United States Patent
Chang et al.

(10) Patent No.: US 7,903,004 B2
(45) Date of Patent: Mar. 8, 2011

(54) DECODING APPARATUS AND METHOD

(75) Inventors: Chiung Hung Chang, Hsinchu Hsien (TW); Ying-Chieh Chiang, Hsinchu Hsien (TW)

(73) Assignee: MSTAR Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 12/542,777

(22) Filed: Aug. 18, 2009

(65) Prior Publication Data

US 2010/0045492 A1    Feb. 25, 2010

(30) Foreign Application Priority Data

Aug. 20, 2008 (TW) .............................. 97131702 A (51) Int. Cl.
*H03M 7/40* (2006.01)
(52) U.S. Cl. ............................. 341/64; 341/70
(58) Field of Classification Search ............ 341/64, 341/63, 70, 71
See application file for complete search history.

(56) References Cited

U.S. PATENT DOCUMENTS 5,770,846 A * 6/1998 Mos et al. ................ 235/440
7,242,658 B2 * 7/2007 Hwang ...................... 369/59.19
7,777,540 B2 * 8/2010 Peng et al. ................ 327/156

* cited by examiner

*Primary Examiner* — Brian Young
(74) *Attorney, Agent, or Firm* — WPAT, PC; Justin King (57) ABSTRACT

A decoding apparatus is disclosed. The decoding apparatus is applied to a data signal comprising a plurality of bits. A plurality of sampled data is generated by sampling the data signal. Each of the bits has a same cycle. The decoding apparatus comprises a calculating module and a determining module. When the calculating module sets a first interval and a second interval in the cycle of a specific bit, the calculating module generates a first count according to the sampled data in the first interval corresponding to a first logic level and generates a second count according to the sampled data in the second interval corresponding to a second logic level. The determining module determines a digital logic value of the specific bit.

16 Claims, 8 Drawing Sheets

DECODING APPARATUS AND METHOD

CROSS REFERENCE TO RELATED PATENT APPLICATION

This patent application is based on a Taiwan, R.O.C. patent application No. 097131702 filed on Aug. 20, 2008.

FIELD OF THE INVENTION

The present invention relates to signal decoding, and more particularly, the present invention relates to a decoding apparatus and a decoding method applied to a radio frequency identification (RFID) system.

BACKGROUND OF THE INVENTION

Figure 1:
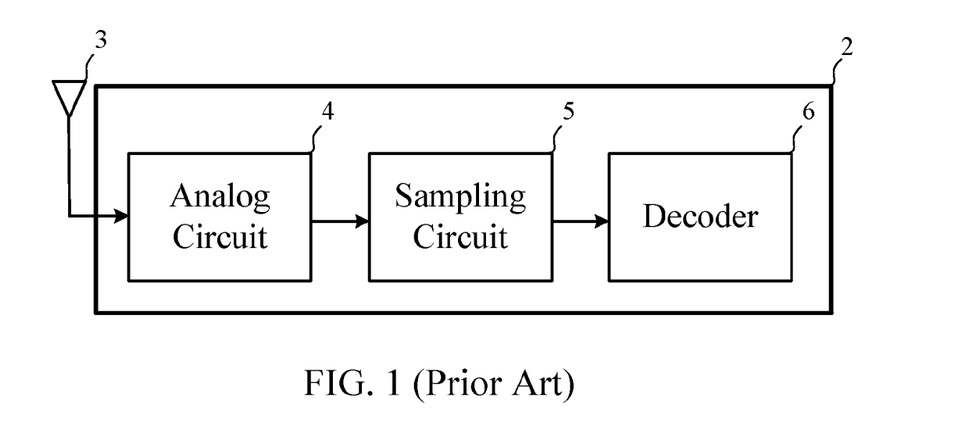
FIG. 1 is a schematic diagram of a high-frequency RFID receiving device in the prior art.

Research related to radio frequency identification (RFID) is rapidly developed in recent years. RFID composed of a tag and a reader is a non-contact, automatic identification technology. Refer to FIG. 1 showing a schematic diagram of a conventional high-frequency RFID receiving device 2 capable of receiving a signal from an RFID reader or an RFID tag via an antenna 3. The signal is transmitted to a decoder 6 after processed by an analog circuit 4 and sampled by a sampling circuit 5.

Generally speaking, the decoder 6 of the high-frequency RFID receiving device 2 applies a correlation method for decoding a header segment and a data segment of the signal. However, decoding errors frequently occur during decryption on the data segment of the signal. The reason for decoding errors is that, whether a digital logic level of a bit in the data segment is 0 or 1 is determined by the decoder 6 according to whether a correlation peak value generated by the bit is greater than a threshold. The result from the decoder 6 determining the digital logic level of the bit has an inseparable relationship with the setting of the threshold of the correlation peak value. Thus, when the threshold is set too low or too high, a decoding error occurs due to incorrect determination made by the decoder 6.

Therefore, it is one of the objectives of the invention to provide a decoding apparatus and a method to solve the problem mentioned above.

SUMMARY OF THE INVENTION

A decoding apparatus is disclosed according to a first embodiment of the present invention. In practice, the decoding apparatus may be implemented to an RFID system for decoding a data signal having a plurality of bits, each of which has a same bit cycle. A plurality of sampled data can be thereafter generated by sampling the data signal.

In this embodiment, the decoding apparatus comprises a calculating module and a determining module. When the calculating module sets a first interval and a second interval in the cycle of a specific bit, the calculating module generates a first count according to the plurality of sampled data corresponding to a first logic level in the first interval, and a second count according to the plurality of sampled data corresponding to a second logic level in the second interval. When the first count and the second count are generated, the determining module determines a digital logic level of the specific bit according to the first count and the second count.

For example, the first logic level and the second logic level are simultaneously logical high or logical low. The first interval is a first half of the cycle of a specific bit; the second interval is a second half of the cycle of the specific bit.

A decoding method is disclosed according to a second embodiment of the present invention. In practice, the decoding method is applied to an RFID system for decoding a data signal comprising a plurality of bits, each of which has a same bit cycle. Before the data signal is decoded, the plurality of sampled data are generated by sampling the data signal.

In the decoding method, a first interval and a second interval in the cycle of a specific bit of the data signal are set. A first count is then generated according to the plurality of sampled data corresponding to a first logic level in the first interval, and a second count is generated according to the plurality of sampled data corresponding to a second logic level in the second interval. A digital logic level of the specific bit is further determined according to the first count and the second count.

For example, the first logic level and the second logic level are simultaneously logical high or logical low. The first interval is a first half of the cycle of the specific bit; the second interval is a second half of the cycle of the specific bit.

In view of the foregoing issue, according to the decoding apparatus and method disclosed in the present invention, the digital logic level of each bit is determined by whether the number of samples at logical high in the first half of the bit cycle is larger than the number of samples at logical high in the second half of the bit cycle. As a result, compared to the prior art, the decoding apparatus and method according to the present invention effectively avoid decoding errors occurred when the correlation method is used for decoding the signal in the traditional RFID system, so as to improve accuracy of signal decoding in the RFID system.

DETAILED DESCRIPTION OF THE PREFERRED EMBODIMENT

Figure 3:
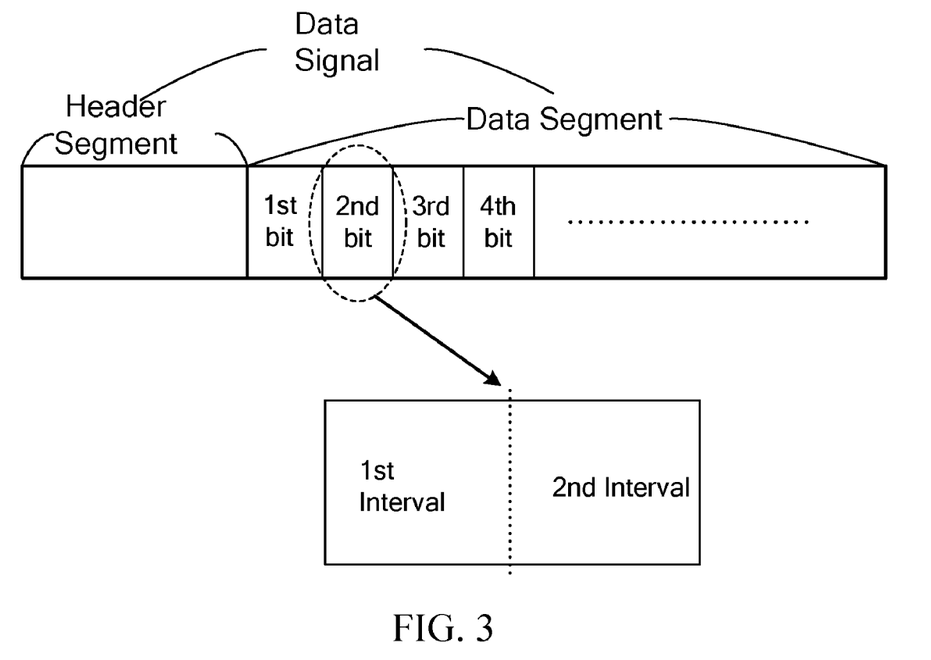
FIG. 3 is an example of a data signal.

The present invention provides a decoding apparatus and method. A decoding apparatus is provided according to a first embodiment of the present invention. In this embodiment, the decoding apparatus is applied to an RFID system for decoding a data signal having a plurality of bits. A plurality of sampled data is generated by sampling the data signal. Referring to FIG. 3, the data signal comprises a header segment and a data segment. The data segment is next to the header segment, comprising a plurality of bits, each of which has the same bit cycle.

In this embodiment, the data signal is encoded by a Manchester encoding method, a differential Manchester encoding method, or other similar methods. The Manchester encoding method is widely applied to local area networks, and is characterized in that, when a digital logic value of a bit of the data signal is 0 or 1, a transition ideally takes place between logical high and logical low near the center of every bit cycle. When the logic level is transferred from high to low, the digital logic value of the bit is designated as 1; when the logic level is transferred from low to high, the digital logic value of the bit is designated as 0.

With respect to the major difference between the differential Manchester encoding method and the Manchester encoding method, in addition to the transition between the logic levels near the center of every bit cycle, the digital logic value of the bit is 0 when the transition takes place at the beginning of the bit cycle; otherwise, the digital logic value of the bit is 1.

Figure 2:
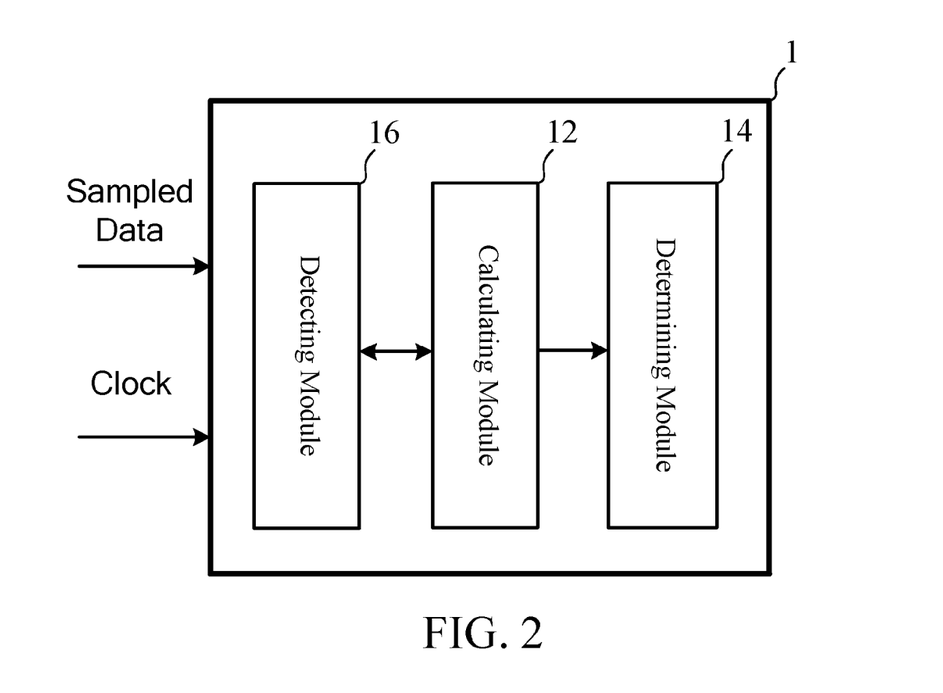
FIG. 2 is a block diagram of a decoding device according to a first embodiment of the present invention.

In this embodiment, the RFID system could be a high-frequency RFID receiving device, but not limited to the same. Referring to FIG. 2, which illustrates a function block diagram of a decoding apparatus 1 in accordance with a first embodiment of the present invention, the decoding apparatus 1 comprises a calculating module 12, a determining module 14, and a detecting module 16. When the detecting module 16, based on a correlation method, detects a header segment of a data signal according to a sampled data, a detecting signal is generated for activating the calculating module 12 according to the starting position of a data segment of the data signal detected by the detecting module 16. That is to say, in order to determine the starting position of the data segment of the data signal, the detecting module 16 detects the header segment of the data signal before the decoding apparatus 1 decodes the bits of the data segment of the data signal. Therefore, the decoding apparatus 1 decodes the bits of the data segment of the data signal only when the header segment of the data signal is detected via the detecting module 16.

Figure 4A:
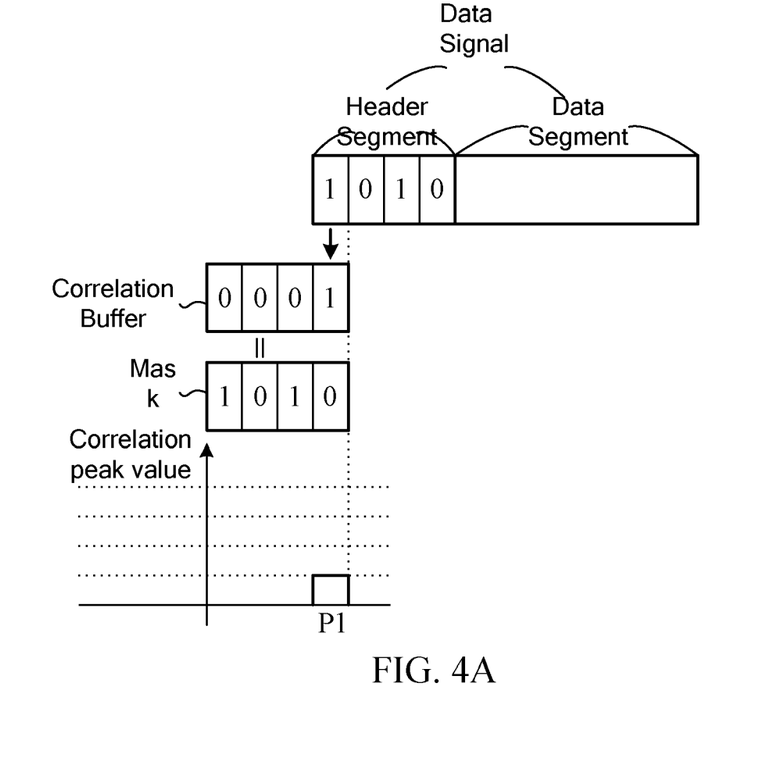
FIG. 4A to FIG. 4D are examples of detecting header segments of data signals implementing a correlation method.

Referring to FIG. 4A to FIG. 4D, which are showing examples of detecting header segments implementing a correlation method to determine the starting position of header segments. Referring to FIG. 4A, suppose four bits contained in the header segment of the data signal are 1, 0, 1, and 0 in sequence. When the header segment is detected by the detecting module 16, the bits already entered a detecting area shall be stored in a correlation buffer in which 0 has been inserted at a position having no bit value. Therefore, when only a first bit 1 of the header segment of the data signal enters the detecting area, the bits of the header segment stored in the correlation buffer are 0, 0, 0 and 1 in sequence.

Four bits stored in the correlation buffer are then compared with four bits which are 1, 0, 1 and 0 stored in a mask by the detecting module 16, so as to determine the degree of correlation between two sets of bits. For example, the mask is changed according to the header segments of different data signals. Referring to FIG. 4A, a correlation peak value is a first peak value P1, indicating only one identical bit, when the second bits of the correlation buffer and the mask are the same, both of which are 0.

Figure 4B:
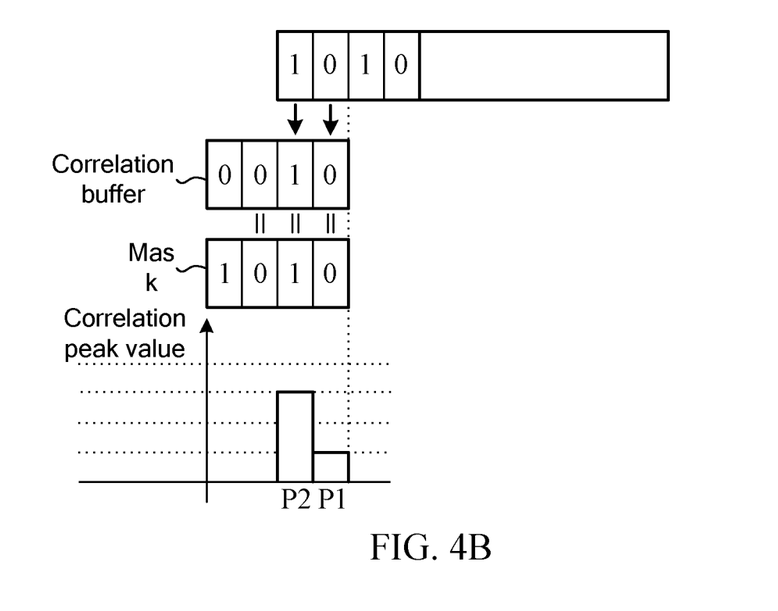

Referring to FIG. 4B, when the first two bits 1 and 0 of the header segment of the data signal enter the detecting area, the bits stored in the correlation buffer are 0, 0, 1 and, 0 in sequence. When the detecting module 16 compares the correlation buffer with the mask, the correlation peak value is a second peak value P2, indicating three identical bits, when the last three bits of the correlation buffer and the mask are the same, both of which are 0, 1, and 0.

Figure 4C:
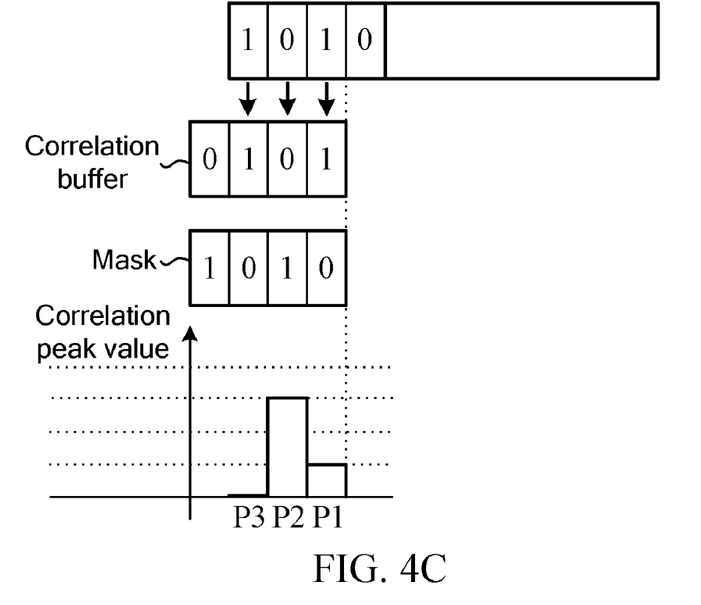

Referring to FIG. 4C, when the first three bits 1, 0, and 1 of the header segment of the data signal enter the detecting area, the bits stored in the correlation buffer are 0, 1, 0, and 1 in sequence. When the detecting module 16 compares the correlation buffer with the mask, the correlation peak value is a third peak value P3, indicating no identical bit, when all bits of the correlation buffer and the mask are different.

Figure 4D:
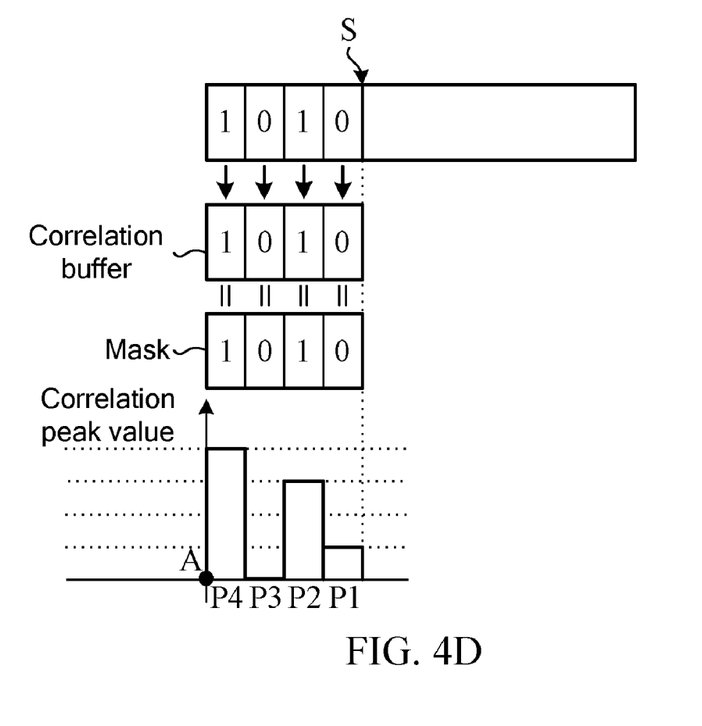

Referring to FIG. 4D, when all bits 1, 0, 1, and 0 of the header segment of the data signal enter the detecting area, the bits stored in the correlation buffer are 1, 0, 1 and 0 in sequence. When the detecting module 16 compares the correlation buffer with the mask, the correlation peak value is a fourth peak value P4, indicating four identical bits, when all bits of the correction buffer and the mask are the same.

When the fourth peak value P4 is detected as a max correlation peak value, the detecting module 16 sets a point A in FIG. 4D as the most appropriate point and determines a starting position S of the data segment. Upon the availability of the starting position S of the data segments, the detecting module accordingly generates a detecting signal for activating the calculating module 12.

In this embodiment, two main functions of the calculating module 12 include: dividing the cycle of the bit in the data segment into a first interval and a second interval, and respectively generating a first count and a second count for the two intervals. The calculating module 12 sets the first interval and the second interval in the cycle of a specific bit of the data signal. Referring to FIG. 3, the first interval is a first half cycle of the bit, the second interval is a second half cycle of the bit, and the total length of the first interval and the second interval is equal to the length of the cycle of the bit.

When setting the first interval and the second interval of the specific bit, the calculating module 12 generates a first count by calculating the number of the sampled data in the first interval corresponding to a first logic level and a second count by calculating the number of the sampled data in the second interval corresponding to a second logic level. In this embodiment, the first logic level is equal to the second logic level; for example, the first logic level and the second logic level are both logical high or logical low. When the calculating module 12 determines that the data signal has ended, the calculating module 12 generates a setting signal to the detecting module 16 for resetting the detecting module 16.

The determining module 14, coupled to the calculating module 12, determines the digital logic value of the specific bit according to the first count and the second count. When the first count is greater than the second count, the determining module 14 determines the digital logic value is 1; when the first count is smaller than the second count, the determining module 14 determines the digital logic value is 0. The determining condition is adapted according to other encoding methods in addition to the Manchester encoding method, the differential Manchester encoding method, or other similar encoding methods used for encoding the data signal in this embodiment.

Figure 5:
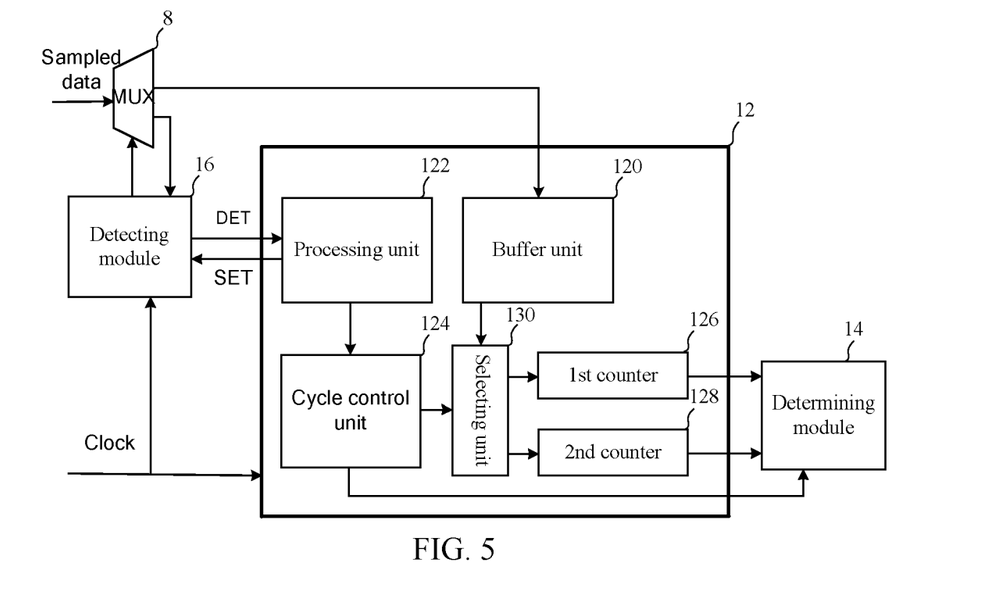
FIG. 5 is a detailed block diagram of a calculating module shown in FIG. 2.

Refer to FIG. 5 showing a detailed function block diagram of the calculating module 12 comprising a buffer unit 120, a data decoding processing unit 122, a cycle control unit 124, a first counter 126, a second counter 128 and a selecting unit 130. The data decoding processing unit 122 is coupled to the detecting module 16. The cycle control unit 124 is coupled to the data decoding processing unit 122, the selecting unit 130 and the determining module 14. The selecting unit 130 is coupled to the buffer unit 120, the first counter 126, and the second counter 128. The buffer unit 120 is coupled to a multiplexer 8. The first counter 126 and the second counter 128 are coupled to the determining module 14.

In this embodiment, the buffer unit 120 is used for storing the sampled data generated by sampling the data signal. The sampled data are transmitted to the buffer unit 120 or the detecting module 16 via a selection of the multiplexer 8.

To initiate detecting the header segment of the data signal, the detecting module 16 controls the multiplexer 8 to transmit the sampled date to the detecting module 16 for detecting the header segment. When the header segment of the data signal is detected, the detecting module 16 switches the multiplexer 8 to transmit sampled data to the buffer unit 120. At the same time, the detecting module 16 generates a detecting signal to the data decoding processing unit 122, so as to instruct the data decoding processing unit 122 to begin with a data decoding procedure. When receiving the detecting signal, the data decoding processing unit 122 generates a cycle count according to the cycle of every bit and the cycle of a sample clock.

More specifically, when dividing the bit cycle by the sample clock, the quotient is the cycle count. When it is detected that the data signal has ended, the data decoding processing unit 122 generates a setting signal to reset the detecting module 16.

The cycle control unit 124 is used for setting the first interval and the second interval of the cycle of the specific bit according to the cycle count and the sample clock generated by the data decoding processing unit 122. More specifically, the cycle control unit 124 counts according to the sample clock. The interval during which the count value does not reach a first half of the cycle count is regarded as a first interval of the bit cycle; the interval during which the count value is beyond the first half of the cycle count but does not reach the cycle count is regarded as a second interval of the bit cycle. That is to say, the cycle control unit 124 divides the cycle of every bit of the data signal into the first half of the cycle (the first interval) and the last half of the cycle (the second interval) and generates a control signal for instructing the first interval and the second interval. The selecting unit 130 then determines whether to transmit the sampled data in the buffer unit 120 to the first counter 126 or the second counter 128 according to the instruction of the control signal.

For example, the control signal controls the selecting unit 130 to transmit the plurality of sampled data in the first interval of the bit cycle to the first counter 126, and to transmit the plurality of sampled data in the second interval of the bit cycle to the second counter 128. The selecting unit 130 can be a multiplexer.

When receiving the plurality of sampled data, the first counter 126 calculates the number of the sampled data in the first interval corresponding to the first logic level to generate a first count. When receiving the plurality of sampled data, the second counter 128 calculates the number of the sampled data in the second interval corresponding to the second logic level to generate a second count. In this embodiment, the first logic level and the second logic level are set as, but not limited to, logical high. The first counter 126 and the second counter 128 then respectively transmit the first count and the second count to the determining module 14, which is also coupled to the cycle control unit 124. When detecting the cycle of the specific bit has ended, the cycle control unit 124 generates a start signal to be transmitted to the determining module 14, so as to instruct the determining module 14 to determine whether the digital logic value of the specific bit is 1 or 0 according to the first count and the second count.

Examples for decoding different signals shall be discussed. In the following examples, counting is on the basis of logical high, but it shall not be construed to limit the scope of the invention. Refer to FIG. 6 to FIG. 10 showing the relationship between the oscillogram and the bit cycle of sampled data under various circumstances. The external frame represents a bit cycle, divided by a dot-dashed line in the middle into two regions: a left region and a right region which respectively represent the first interval and the second interval. Other dash lines represent sampling positions of the sampling clock, the frequency of which is at least twice as that of the sampled data. Twice the frequency is used as an example in Figures below.

Figure 6A:
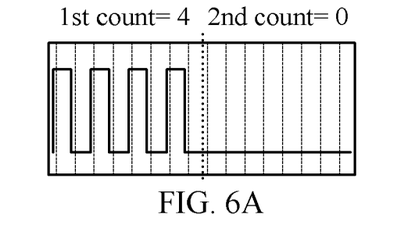
FIG. 6 to FIG. 10 show various examples of signal decoding.
Figure 6B:
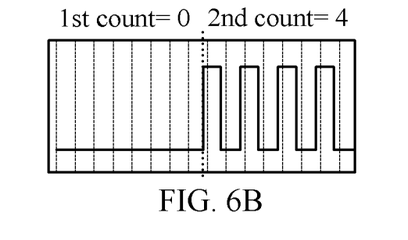

Refer to FIG. 6A and FIG. 6B showing sampled data under ideal circumstances. Referring to FIG. 6A, sampled data have eight sampling points in the first interval of the bit cycle, with four sampling points being logical high and four sampling points being logical low, therefore the first count value is 4; in the second interval of the bit cycle, the data signal has eight sampling points at logical low, therefore the second count value is 0. The first count value is greater than the second count value, and the digital logic level of the bit is determined as 1 by the determining module 14 as a result. Referring to FIG. 6B, the first count value 0 is smaller than the second count value 4, and the digital logic level of the bit is determined as 0 as a result.

Figure 7A:
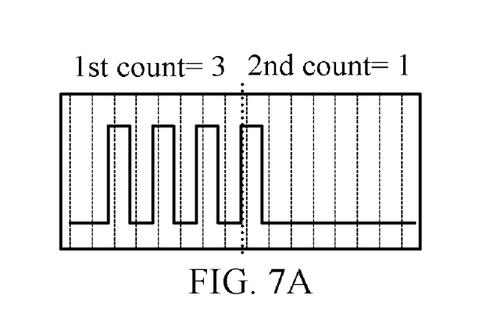
Figure 7B:
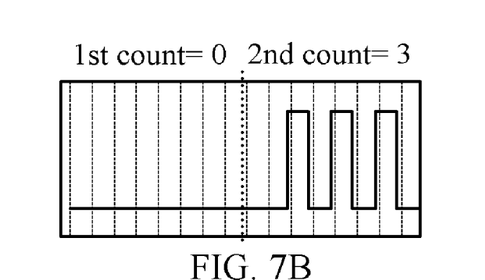

Refer to FIG. 7A and FIG. 7B showing a shift to the right of sampled data in the bit cycle. Referring to FIG. 7A, three sampling points are at logical high in the first interval of the bit cycle, therefore the first count value is 3; one point is at logical high in the second interval of the bit cycle, therefore the second count value is 1. The first count value is greater then the second count, and the digital logic level of the bit is determined as 1 as a result. Referring to FIG. 7B, the first count value 0 is smaller than the second count value 3, and the digital logic level of the bit is determined as 0 as a result.

Figure 8A:
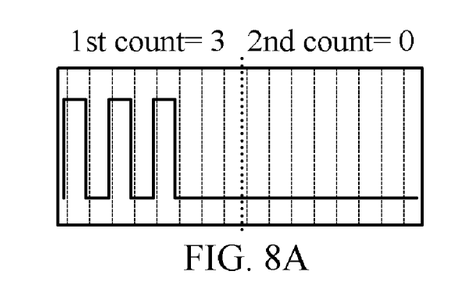
Figure 8B:
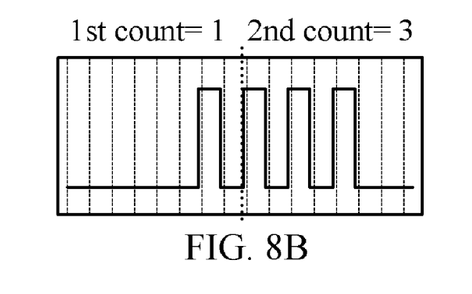

Refer to FIG. 8A and FIG. 8B showing a shift to the left of sampled data in the bit cycle. Referring to FIG. 8A, three sampling points are at logical high in the first interval of the bit cycle, therefore the first count value is 3; no points are at logical high in the second interval of the bit cycle, therefore the second count value is 0. The first count value is greater then the second count, and the digital logic level of the bit is determined as 1 as a result. Referring to FIG. 8B, the first count value 1 is smaller than the second count value 3, and the digital logic level of the bit is determined as 0 as a result.

In view of the foregoing examples, with a little shift of sampled data, the decoding apparatus 1 of the present invention is still capable of correct decoding.

Figure 9A:
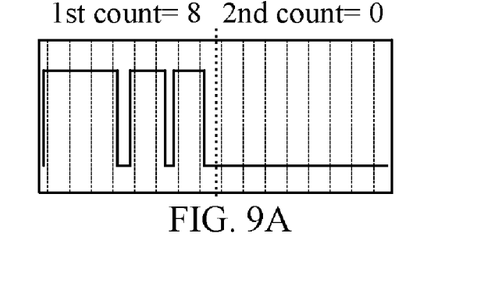
Figure 9B:
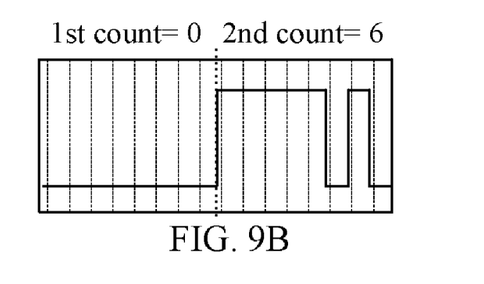

Refer to FIG. 9A and FIG. 9B showing sampled data with a high intensity. Referring to FIG. 9A, eight sampling points are at logical high in the first interval of the bit cycle, therefore the first count value is 8; no points are at logical high in the second interval of the bit cycle, therefore the second count value is 0. The first count value is greater then the second count, and the digital logic level of the bit is determined as 1 as a result. Referring to FIG. 9B, the first count value 0 is smaller than the second count value 6, and the digital logic level of the bit is determined as 0 as a result.

Figure 10A:
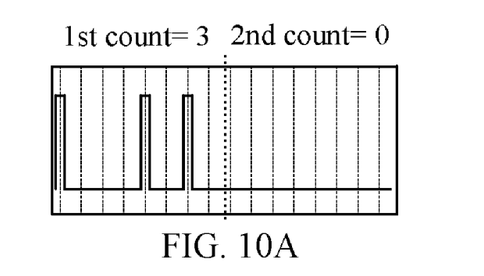
Figure 10B:
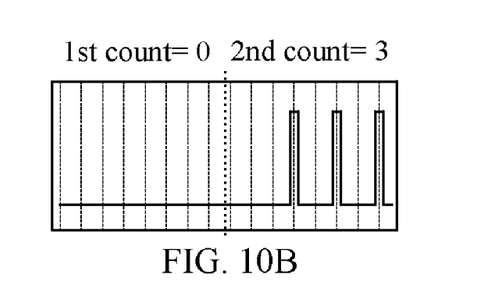

Refer to FIG. 10A and FIG. 10B showing a low intensity of sampled data. Referring to FIG. 10A, three sampling points are at logical high in the first interval of the bit cycle, therefore the first count value is 3; no points are at logical high in the second interval of the bit cycle, therefore the second count value is 0. The first count value is greater than the second count, and the digital logic level of the bit is determined as 1. Referring to FIG. 9B, the first count value 0 is smaller than the second count value 3, and the digital logic level of the bit is determined as 0 as a result.

In view of the foregoing examples, when the intensity of sampled data changes, the decoding apparatus 1 of the present invention is still capable of correct decoding. As a result, according to the disclosure in FIG. 7 to FIG. 10, the decoding apparatus 1 is capable of dealing with various conditions of different sampled data, thereby rendering better flexibility in practical applications.

In addition, the digital logic level of the bit is determined as 0 when the first count value is equal to the second count value. Whether the decoding result of every bit of sampled data is correct is determined by a subsequent circuit. For example, check codes of a series of data are used for determining whether the digital logic values of the bits are correctly decoded. When the smaller value of the first count value and the second count value gets too large, it is considered as a collision.

A decoding method is disclosed according to a second embodiment of the invention. For example, the decoding method is applied to an RFID system to decode a data signal comprising a plurality of bits, each of which has a same bit cycle. The data signal is encoded by a Manchester encoding method, a differential Manchester encoding method, or other similar encoding methods. The data signal comprises a header segment and a data segment next to the header segment. It is to be noted that, when the data signal is decoded by the decoding method, a plurality of sampled data are generated by sampling the data signal.

Figure 11:
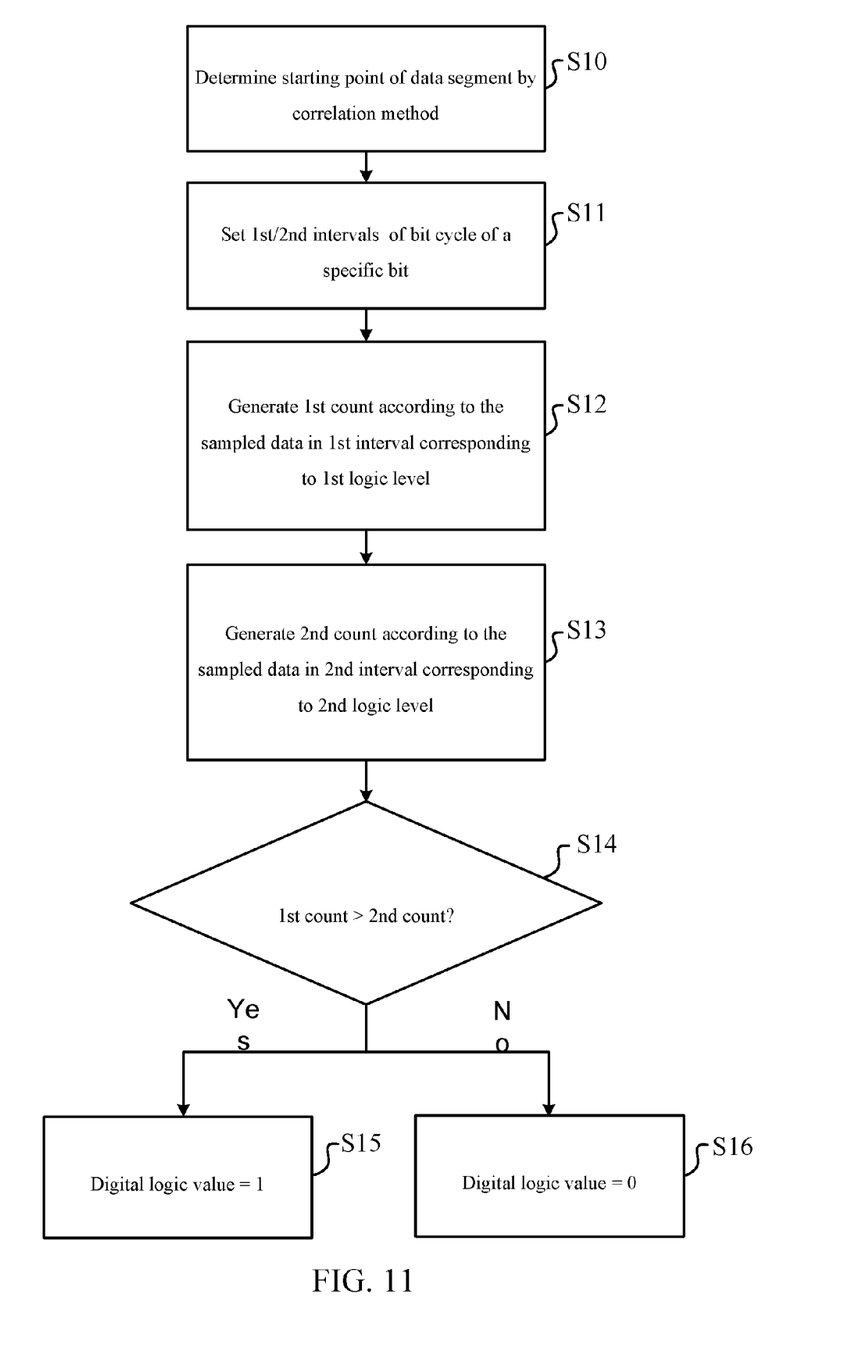
FIG. 11 is a flow chart of a decoding method according to a second embodiment of the present invention.

Refer to FIG. 11 showing a flow chart of the decoding method. The method begins with Step S10 in which a correlation method is used for detecting the header segment to determine a starting position of the data segment. In Step S11, a first interval and a second interval in the cycle of a specific bit of the plurality of sampled data are set. In Step S12, a first count is generated according to the sampled data in the first interval corresponding to a first logic level. In Step S13, a second count is generated according to the sampled data in the second interval corresponding to a second logic level.

In this embodiment, the first logic level is equal to the second logic level; for example, both the first logic level and the second logic level are logical high or logical low. In addition, the first interval is a first half of the bit cycle, and the second interval is a second half of the bit cycle. The total length of the first interval and the second interval is equal to the length of the bit cycle.

When the first count and the second count are generated, Step S14 determines whether the first count is greater than the second count is executed. If the first count is greater than the second count, Step S15 of determining the digital logic value of the specific bit is 1 is executed; if the first count is smaller than the second count, Step S16 of determining the digital logic value of the specific bit is 0 is executed. The determining condition is adapted according to other encoding methods in addition to the Manchester encoding method, the differential Manchester encoding method, or other similar encoding methods used for encoding the data signal in this embodiment.

In this embodiment, a correlation method is used for detecting the header segment of the data signal so as to identify the starting position of the data segment of the data signal.

In view of the foregoing issue, according to the decoding apparatus and method disclosed in the present invention, the digital logic value of each bit is determined by whether the number of sampled points at logical high in the first half of the bit cycle is larger than the number of sampled points at logical high in the second half of the bit cycle. As a result, compared to the prior art, the decoding apparatus and method according to the present invention effectively avoid decoding errors occurred when a correlation method is used for decoding a signal in a traditional RFID system, so as to improve accuracy of signal decoding in an RFID system.

While the invention has been described in terms of what is presently considered to be the most practical and preferred embodiments, it is to be understood that the invention needs not to be limited to the above embodiments. On the contrary, it is intended to cover various modifications and similar arrangements included within the spirit and scope of the appended claims which are to be accorded with the broadest interpretation so as to encompass all such modifications and similar structures.

What is claimed is:

1. A decoding method, applied to a data signal comprising a header segment and a data segment, the header segment and the data segment comprises the plurality of bits, each of the plurality of bits having a same bit cycle, a plurality of sampled data being generated by sampling the data signal, the decoding method comprising steps of:
   (a) setting a first interval and a second interval in the bit cycle;
   (b) generating a first count according to the sampled data in the first interval corresponding to a first logic level;
   (c) generating a second count according to the sampled data in the second interval corresponding to a second logic level;
   (d) determining a digital logic value of the specific bit according to the first count and the second count; and
   (e) detecting the header segment by a correlation method to determine a starting position of the data segment.

2. The decoding method as claimed in claim 1, wherein the data signal is encoded by a Manchester encoding method.

3. The decoding method as claimed in claim 2, wherein the first logic level and the second logic level are logical high, the first interval is a first half of the bit cycle and the second interval is a second half of the bit cycle, and the digital logic value is determined as logic-high when the first count value is greater than the second count value in the step (d).

4. The decoding method as claimed in claim 1, wherein the data signal is encoded by a differential Manchester encoding method or a variation of a Manchester encoding method.

5. The decoding method as claimed in claim 1, wherein the first logic level is equal to the second logic level.

6. The decoding method as claimed in claim 1, wherein a total length of the first interval and the second interval is equal to a length of the bit cycle.

7. A decoding apparatus applied to a data signal comprising a header segment and a data segment, and the header segment and the data segment comprises the plurality of bits, each of the plurality of bits having a same bit cycle, and a plurality of sampled data being generated by sampling the data signal, the decoding apparatus comprising:
   a calculating module, for setting a first interval and a second interval in the bit cycle, generating a first count according to the sampled data in the first interval corresponding to a first logic level, and generating a second count according to the plurality of sampled data in the second interval corresponding to a second logic level;
   a determining module, coupled to the calculating module, for determining a digital logic level of the specific bit according to the first count and the second count; and
   a detecting module, coupled to the calculating module, determining a starting position of the data segment and generating a detecting signal to activate the calculating module when the header segment is detected according to a correlation method.

8. The decoding apparatus as claimed in claim 7, wherein the data signal is encoded by a Manchester encoding method.

9. The decoding apparatus as claimed in claim 8, wherein the first logic level and the second logic level are logical high, the first interval is a first half of the bit cycle and the second interval is a second half of the bit cycle, and the digital logic value is determined as 1 when the first count value is greater than the second count value.

10. The decoding method as claimed in claim 7, wherein the data signal is encode by a differential Manchester encoding method or a variation of a Manchester encoding method.

11. The decoding apparatus as claimed in claim 7, wherein the first logic level is equal to the second logic level.

12. The decoding apparatus as claimed in claim 7, a total length of the first interval and the second interval is equal to a length of the bit cycle.

13. The decoding apparatus as claimed in claim 7, wherein the calculating module generates a setting signal to reset the detecting module when the calculating module determines the data signal has ended.

14. The decoding apparatus as claimed in claim 7, wherein the calculating module comprises:
 a buffer unit, for storing the sampled data;
 a data decoding processing unit, for generating a cycle count according to the bit cycle and a cycle of a sampling clock;
 a cycle control unit, coupled to the data decoding processing unit, for setting the first interval and the second interval according to the cycle count and the sampling clock;
 a first counter coupled to the cycle control unit, the buffer unit, and the determining module, calculating the first count from the sampled data corresponding to the first logic level; and
 a second counter coupled to the cycle control unit, the buffer unit, and the determining module, calculating the second count from the sampled data corresponding to the second logic level;
 wherein the sampled data are generated by sampling the data signal in response to the sampling clock.

15. The decoding apparatus as claimed in claim 14, wherein the cycle control unit generates a control signal for determining the first interval and the second interval, the calculating module further comprising:
 a selecting unit coupled to the buffer, the cycle control unit, the first counter, and the second counter, wherein the selecting unit selectively transmits the sampled data to the first counter or the second counter according to the control signal.

16. The decoding apparatus as claimed in claim 14, wherein the cycle control unit is further coupled to the determining module, and generates a starting signal according to the cycle count and the sampling clock, so as to instruct the determining module to determine the digital logic level of the specific bit.

* * * * *